United States Patent [19]

Herman et al.

[11] Patent Number: 5,059,977
[45] Date of Patent: Oct. 22, 1991

[54] SYNCHRONIZING SWITCH ARRANGEMENT FOR A DIGITAL-TO-ANALOG CONVERTER TO REDUCE IN-BAND SWITCHING TRANSIENTS

[75] Inventors: Ray M. Herman, Huntington Beach; Anthony L. McKay, Long Beach; Andrew M. Chao, San Marino, all of Calif.

[73] Assignee: Magnavox Government and Industrial Electronics Company, Fort Wayne, Ind.

[21] Appl. No.: 562,165

[22] Filed: Aug. 3, 1990

[51] Int. Cl.$^5$ .............................................. H03M 1/66
[52] U.S. Cl. ................................... 341/144; 341/118; 341/141
[58] Field of Search ................ 341/118, 120, 133, 136, 341/141, 144, 147, 148, 149, 153, 154

[56] References Cited

U.S. PATENT DOCUMENTS

| | | | |
|---|---|---|---|
| 3,877,023 | 4/1975 | Spicer et al. | 341/118 |
| 4,405,916 | 9/1983 | Hornak et al. | 341/118 X |
| 4,521,765 | 6/1985 | Wang et al. | 341/154 |
| 4,565,961 | 1/1986 | Hornak et al. | 341/118 X |
| 4,587,477 | 5/1986 | Hornak et al. | 341/118 X |
| 4,591,832 | 5/1986 | Fling et al. | 341/141 |
| 4,633,610 | 5/1987 | Metz et al. | 341/153 |
| 4,639,619 | 1/1987 | Baldwin et al. | 307/352 |

*Primary Examiner*—Howard L. Williams
*Attorney, Agent, or Firm*—Roger M. Rickert; Richard T. Seeger

[57] ABSTRACT

A digital-to-analog converter receives a stream of input words and selectively couples a plurality of current sources to produce a DAC output signal. The DAC includes a set of series-connected synchronizing switches and data switches between the current sources and the output lines, and operates the switches such that the current sources are not coupled to the data switches until the data switch transients have ended.

27 Claims, 6 Drawing Sheets

SYNCHRONIZING SWITCH ARRANGEMENT FOR A DIGITAL-TO-ANALOG CONVERTER TO REDUCE IN-BAND SWITCHING TRANSIENTS

BACKGROUND OF THE INVENTION

1. Field of the Invention

This invention relates generally to digital-to-analog converters and, more particularly, to digital-to-analog converters operable at high conversion speeds.

2. Description of the Related Art

A digital-to-analog converter (DAC) converts a digital input, consisting of a sequence of bits making up an input data word, into an analog output representing the value of the binary input data word. A DAC can be implemented with a set of switches that control the summation of a set of weighted analog current sources such that the DAC output is a current that is the sum of currents from any combination of the current sources. Each bit of the input data word determines whether or not a corresponding current source is summed at the output. For each bit of the input word that is high, the associated current source is coupled to the DAC output, while for each bit that is low, the associated current source is not coupled. The sum of the coupled current sources produces a current amplitude at the DAC output that is proportional to the binary value of the input data word. If a binary weighting is used, each current source has a current which is double the current of the next previous smaller current source. Thus an n-bit DAC would sum n binary weighted current sources in 2 to the nth possible combinations to produce 2 to the nth possible values of the n-bit input word.

Among other applications, DACs are used in systems called direct digital synthesizers (DDS) to generate a sampled, usually periodic, analog waveform from a series of digital words. That is, a continuous function is represented by a series of discrete sample values taken at sample intervals and provided as input data to a DAC. Thus, the sampled analog waveform has a discrete amplitude during a short sampling time period, which then steps to a new amplitude with each new sampling period to produce a waveform that is a well controlled representation of the continuous function. For example, the analog waveform might be a sine function, the sampling periods being discrete intervals of the function. The discrete intervals define values of the sine waveform that are provided as input to the DAC. Such a waveform can be used as a carrier wave in a communications application. DAC's are especially useful in a DDS because the output amplitude of the DAC can be precisely controlled by the values of the digital words, the period of the output waveform can be changed very rapidly, and the sample timing can be controlled by a high precision, periodic clocking signal.

An important parameter of a DDS system generating a sampled analog output waveform is the range of frequencies that can be generated at the output. It is well known that the maximum output bandwidth of a sampled analog waveform is determined by the Nyquist limit to be half of the sampling frequency. To generate a 1 GHz sine wave, for example, it is necessary to sample the function at a frequency of at least 2 GHz, or two data points per cycle. To increase the range of output frequencies that can be generated, the sampling frequency must be increased. High sampling frequencies require DACs that can transition from one output value to another very quickly.

A second important parameter of a DDS system is what is referred to as the spurious response. Many applications for a DDS system require that the output waveform cover a wide range of possible frequencies, and also that the waveform have very low amplitude components at frequencies other than the frequency desired at any particular time. The relative amplitudes of these undesired frequency components define the spurious response. Due to the step-like nature of a sampled waveform, the DDS output waveform contains frequency components that are greater than one-half of the sampling frequency. These frequency components are out of the range of desired output frequencies and make up the out-of-band spurious response. They generally are undesirable, but can be easily removed by a filter which passes only frequencies that are in the desired output frequency range.

A more serious problem with the DDS stems from the spurious frequency components that fall within the desired range of output frequencies. This in-band spurious response is caused primarily by errors in the accuracy of the DAC output amplitude at each sample period. These amplitude errors are due to two sources: the limited resolution determined by the number of bits in the DAC input word; and the limited accuracy with which the analog output matches the value of the digital input word. The number of bits in the DAC input word are determined by the architecture of the system in which the DDS will operate. The accuracy limitations of the DAC analog output stem from two sources: the static accuracy of the current sources, and the transient effects. The static accuracy is a measure of how accurately each current source represents the amplitude associated with a specific bit in the input word. Conventional high precision current sources have been developed, greatly increasing the static accuracy. The transient effects are more troublesome to deal with, and are the subject of this invention. Transient effects will be discussed next in greater detail.

An ideal DAC will step from one output value to another instantaneously. However, all practical DACs will have transient effects and require some time for the output amplitude to settle to each new output value. In switching from one output value, or state, to another all DACs produce what is known as a glitch for the period of time during which the output has not settled to its final dc value. The glitch comprises spurious energy in the output waveform. For high speed DACs the glitch duration may be a significant portion of the total sample time, and this glitch can therefore severely limit the accuracy of the output in matching the value of the digital input.

All DACs produce a glitch during the transition from one output state to another. However, only part of the energy in the glitch actually falls at spurious in-band frequencies. If the glitch energy is constant for each sample step or clock cycle, then this energy occurs at the sampling frequency and/or at higher harmonics. These frequencies are therefore out-of-band and do not cause an in-band spurious frequency problem. They can be filtered out of the output using conventional filtering techniques. Also, if the glitch energy is proportional to the value of the output amplitude, or to the value of the step in the output amplitude, then the glitch energy is at the frequency of the desired output frequency. This also does not cause a spurious frequency problem.

In-band spurious frequencies can be generated if the glitch is dependent on the input data, and on other factors not directly proportional to the values of the amplitudes involved in the output state transition. An example of such data dependent glitches can be seen by examining the transitions between input words 100 . . . 001 and 100 . . . 000, and between 100 . . . 000 and 011 . . . 111. In the first transition only the least significant bit in the input word changes, and only the smallest current source must be switched out of the output summation. All of the other current sources are not switched in the transition but remain steady, and a very small glitch can be expected. The second transition from 100 . . . 000 to 011 . . . 111 is also a one-bit change, but involves switching out the largest current source and switching in all of the remaining current sources. If the switching out of the largest current source is delayed with respect to the switching in of the other current sources, the DAC output will have a large error for a short time interval, and a large glitch energy can be expected. Both the first and second transitions have the same magnitude of change (a difference of one bit) and are very close in amplitude, yet the transitions produce glitch energies that are very different.

Such small data changes with large current-switching effects can occur with regularity in a DDS. In general, the sampling frequency of the analog waveform will not be an integral multiple of the desired periodic output frequency, and the input data will step through sample values that are different data words for each cycle of the desired frequency. For example, if a sine wave is to be produced, the input words comprising the sine values to be converted will not be identical for each cycle. Therefore, transitions with large glitch energies and transitions with small glitch energies will be occurring with periodicities that might be different from the period of the desired output frequency, thus leading to spurious frequencies, some of which can be in-band.

The data dependent glitches can be caused from several sources. The control signals operating the current switches might arrive at the switches skewed in time with respect to each other. This can be due either to non-uniform delays in the individual logic signal source circuitry driving each switch or to differences in the loads presented to each signal source circuit by each switch. Further, the time for each switch to change state will differ slightly, even with the same control signal timing. This effect is made worse by the fact that each switch controls different magnitudes of current; this can also affect switching time. Glitches can also be generated if switches have turn-off times that are different from turn-on times. In addition, there are usually parasitic effects in the switching circuitry that can couple the control signals of the switches directly to the output, thereby producing glitch-like effects.

From the discussion above, it should be apparent that there is a need for a DAC that can operate at high speeds with significantly reduced distortions in the output signal, which are ordinarily caused by switching transients and glitch effects. The present invention satisfies this need.

SUMMARY OF THE INVENTION

The present invention provides a switching arrangement in a digital-to-analog converter (DAC) with switching control units that substantially eliminate the transient effects that distort the analog output when the DAC transitions from one output value to another. The DAC receives a sequence of data input bits that comprise digital data words representing a sampled input signal. The data is received on input lines coupled to a plurality of electric signal sources that are selectively summed to produce an output signal that represents the sampled input analog signal. For each electric signal source of the DAC, the invention incorporates a switching matrix comprising a set of two series-connected switching control units, or switches, a synchronizing switch and a data switch. A plurality of these sets of series-connected switches are used to perform the DAC function. The synchronizing switch couples the electric signal from the sources to the data switch in a constant periodic manner dependent on the same frequency, while the data switch opens and closes depending on the data input bits to apply the electric signal to the output lines and produce the DAC output signal. The switching control units can take many forms, as described further below, and the electric signal sources can comprise, for example, electric current sources.

A synchronizing switch is advantageously associated with each electric signal source, such as a current source, and operates at the sampling frequency to synchronize the coupling of the current sources at the sampling frequency. The synchronizing switches are all operated concurrently to assure that all current sources are switched to the data switches at substantially the same time. A data switch is also advantageously associated with each current source, and determines which current sources will be summed at the output, depending on the value of the data input bit corresponding to that particular current source. A DAC controller controls the timing of the switching unit operation such that a data switch changes states between open and closed only during a time when the data switch is not carrying current to the output lines. The controller assures such timing by operating the synchronizing switch such that the switch shuts off current to the data switch for a fraction of each cycle of the sampling frequency. This arrangement reduces any glitch caused by skew in the timing between the different bits in the data word. Such a switching structure can be implemented in a variety of ways. The synchronizing switches and the data switches can, for example, comprise single pole switches, or one set of switches can be single pole and the other can be double pole. Finally, all of the switches can advantageously be double pole switches.

Multiple sets of data switches can be provided for each input data bit, such that the input data words are demultiplexed to each set of data switches. That is, two data switches can be connected to each data input bit position, and data can be coupled to first one switch and then the other such that a data switch is opened or closed in response to data only when it is not connected to a current source. In this way, data input words are provided to the DAC at the system clock rate, while the changes in state for each of the data switches occur at half that rate, thus producing out of band noise transients. Such a DAC configuration reduces the switching frequency and reduces the transients due to settling on the lines, thereby largely eliminating distortion in the output signal due to switching transients and glitches.

Other features and advantages of the present invention will become apparent from the following detailed description, taken in conjunction with the accompanying drawings, which illustrate by way of example the principles of the invention.

DESCRIPTION OF THE PREFERRED EMBODIMENTS

Figure 1:
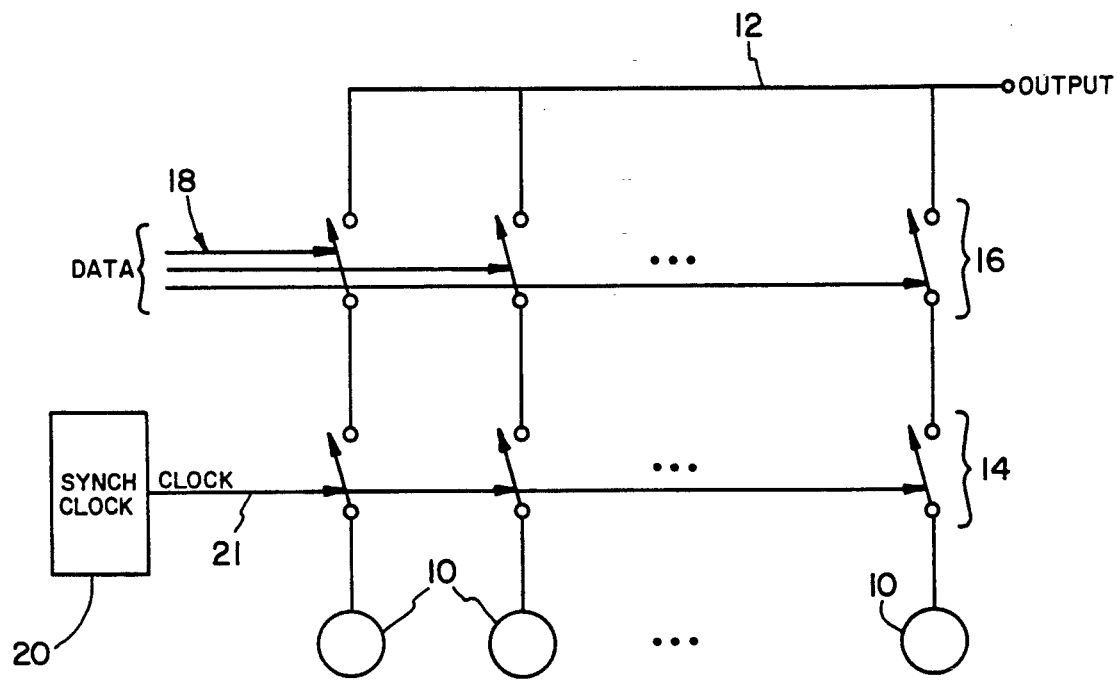
FIG. 1 is a functional schematic diagram of a switching arrangement in accordance with the present invention.

A schematic diagram of a digital-to-analog converter (DAC) in accordance with the present invention is illustrated in FIG. 1. The DAC is placed within a device (not shown) for the purpose of converting a stream of digital input values into an analog signal. The device can, for example, comprise a direct digital synthesizer (DDS) in which digital values representing sampled values of a sine function are provided as input to the DAC, which then re-creates the sine function. The DAC includes a set of n precision binary-weighted current sources 10 that are coupled to an output line 12 by a matrix of single pole synchronizing switches 14 and single pole data switches 16. The input data bits are received on n input lines 18 that are coupled to the current sources by the synchronizing switches and the data switches. The operation of the data switches is controlled by the data input bits, while a synchronizing clock 20 controls the synchronizing switches. In particular, the clock controls the synchronizing switches in common such that all of the synchronizing switches are open while the data input bits are clocked to the data switches. This switching operation reduces the transient effects that would otherwise appear on the DAC output line 12.

Figure 2:
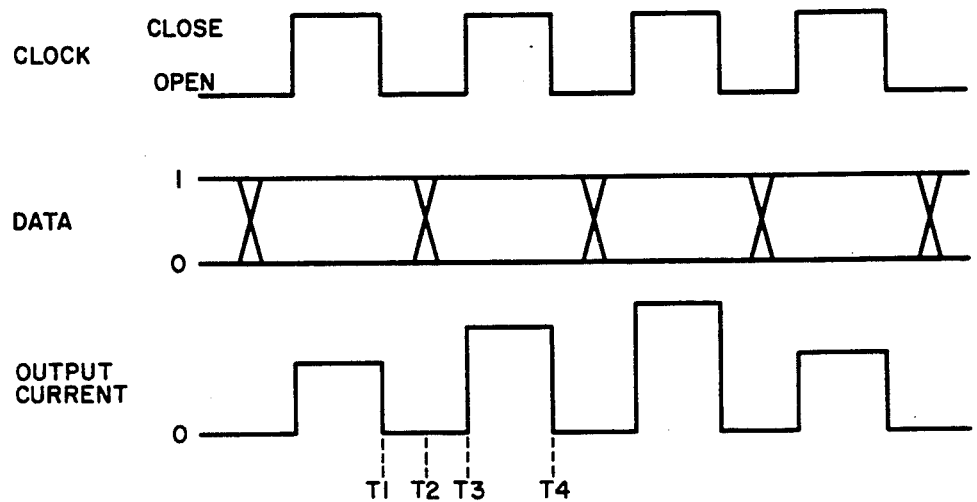
FIG. 2 is a timing diagram of the operation of the switching arrangement of FIG. 1.

One data switch 16 is associated with each one of the DAC input lines 18, and is switched into an open state or a closed state depending on the value of the input data bit. For example, if a data input bit is high, the associated data switch is closed, and if the data input bit is low, the data switch is opened. The synchronizing switches 14 operate under control of the synchronizing clock 20, which operates at a predetermined sampling frequency. The timing of both types of switches is shown in FIG. 2, which illustrates that the synchronizing clock 20 generates a CLOCK signal on a signal line 21 to open all of the synchronizing switches 14 at a time T1 for a period during which a data input word is clocked to the data switches 16, with each bit of the data input word going to the data switch associated with the appropriate weighted current source 10. That is, the switches are operated such that the data switches change states only when there is no current flowing through them. The time interval during which the current switches are open is shown in FIG. 2 as the time interval from time T1 to time T3. Sometime during this open interval, the data word is changed to its next value. Because this change occurs when current is not flowing, any skew in the transition times of the different data switches has little effect on the output signal and does not lead to glitches.

At time T3 in FIG. 2, the current synchronizing switches 14 are all closed in unison. Because the data switches 16 have been pre-set to the appropriate position and have reached a settled condition, the currents from the weighted current sources 10 are summed at the output line 12 to a value proportional to the analog value of the input data word. This occurs during the time period T3 to T4 in FIG. 2. At time T4 the synchronizing switches open in unison and the cycle repeats with the next data word.

The arrangement and operation of the switches shown in FIGS. 1 and 2 leads to a reduction of the in-band spurs due to glitches caused by skew between the bits of the data word when the DAC is used in a direct digital synthesizer (DDS) application. Although a glitch is still generated when the synchronizing switches 14 are opened, this glitch occurs regularly, at the sampling frequency, with an amplitude that is dependent only on the value of the output. Therefore, the glitches contribute frequency components only at the desired output frequency, and at the sampling frequency and its harmonics; little or no in-band spurious frequency components are generated by these glitches.

Other variations of the FIG. 1 configuration of a DAC in accordance with the invention are possible and can offer additional benefits. One such variation is shown in the functional schematic diagram of FIG. 3. This variation utilizes a pair of data switches 22 and 24, designated as DATA A switches and DATA B switches, respectively, for each current source 10. The data switches operate under control of a demultiplexer 26. In this configuration, each synchronizing switch 28 is implemented with a double-throw switch. The synchronizing switches are again operated in unison under control of a CLOCK signal from the synchronizing clock 20 over a clock signal line 21 so that the current sources are connected to the data switches 22 and 24 only when the associated data switch is not changing state.

Figure 3:
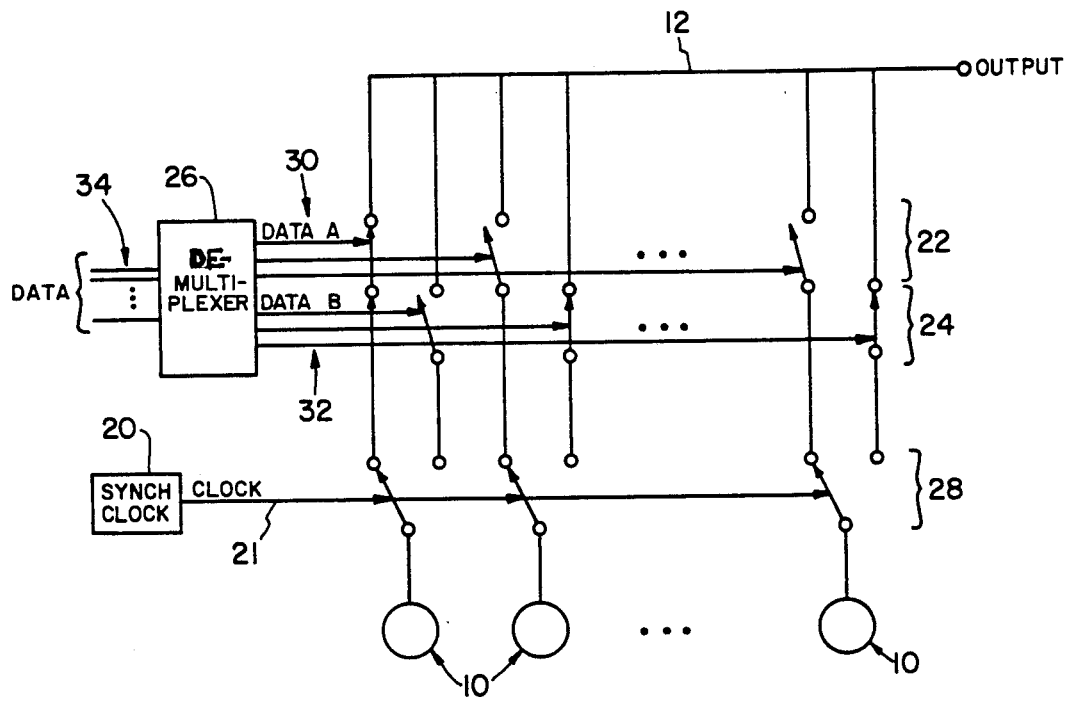
FIG. 3 is a functional schematic diagram of another embodiment of the present invention.

In the DAC Configuration of FIG. 3, two data switches are provided for each current source, referred to as a DATA A switch and a DATA B switch. Therefore, each of the current sources 10 is alternately connected first to a data switch from the DATA A set of switches 22, and then to a data switch from the DATA B set of switches 24. The data words being input to the DAC at the clock 20 sampling rate are demultiplexed onto two sets of data control lines 30 and 32, each line transmitting data at half the sampling rate. Each set of data control lines controls a set of data switches; one set of control lines 30 controls the DATA A switches 22, the other set of data control lines 32 controls the DATA B switches 24. The data words at the input lines 34 of the demultiplexer 26 are directed by the demultiplexer to the alternate sets of control lines 30 and 32. Thus, as a new input word appears on one set of data control lines, the previous word is held stable on the other set of data control lines. Therefore, every other data input word is directed to the DATA A set of lines 30, while the remaining data input words are directed to the DATA B set of lines 32.

Figure 4:
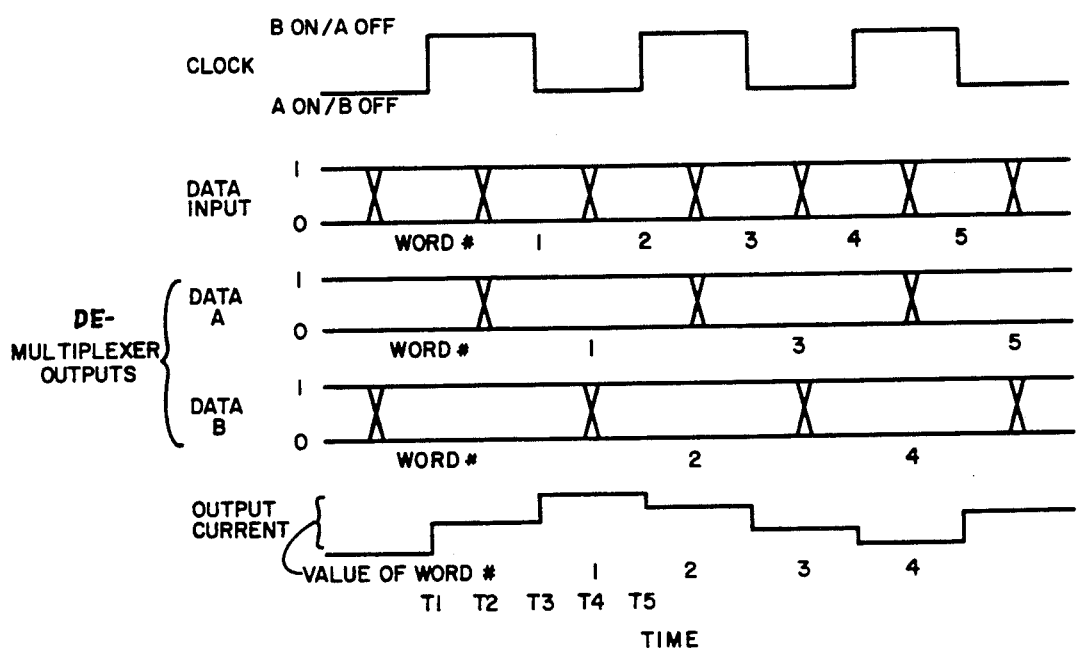
FIG. 4 is a timing diagram of the operation of the switching arrangement of FIG. 3.

The operation of this configuration is described by the timing diagram of FIG. 4. Starting at time T1 of FIG. 4, the synchronizing switches 28 are positioned to connect the current sources 10 to the data switches 24 of the DATA B set. At time T2 the demultiplexer 26 clocks the first data word from the DAC input lines 34 to the data control lines 30 for the DATA A set of data switches 22. At time T3 the synchronizing switches are closed in unison to connect the current sources 10 to the DATA A set of data switches 22 and to disconnect the current sources from the DATA B set of data switches 24. Because the data control lines of the DATA A set of switches have been preset to the first data word and have reached a settled condition, the current at the output lines will transition to a value proportional to the value of the first data word.

At time T4 the demultiplexer 26 clocks the second data word from the DAC input lines 34 to the data control line 32 for the DATA B set of data switches 24, while holding the first data word stable on the DATA A set of control lines 30. At time T5 the synchronizing switches 28 change state, or are flipped, to connect the current sources 10 to the data switches of the DATA B set, and the output signal transitions from a value proportional to the first data word to a value proportional to the second data word. Now the process repeats with the third data word being clocked to the DATA A set of data control lines 30, while the second data word remains stable on the DATA B set of data control lines 32.

The FIG. 3 configuration with demultiplexed data switches offers several advantages over the basic configuration illustrated in FIG. 1. First, the output has a 100% duty factor. The output signal makes a transition from one data word value to the next data word value without going to zero for a short time interval during each sample, as occurs in the case of the basic configuration. This increases the average power of the desired output and decreases the undesired components at the sample frequency. Second, the data switches 22, 24 and the synchronizing switches 28 cycle at a frequency of one-half of the sampling frequency, which can potentially allow the DAC to operate at a higher sampling frequency.

Figure 5:
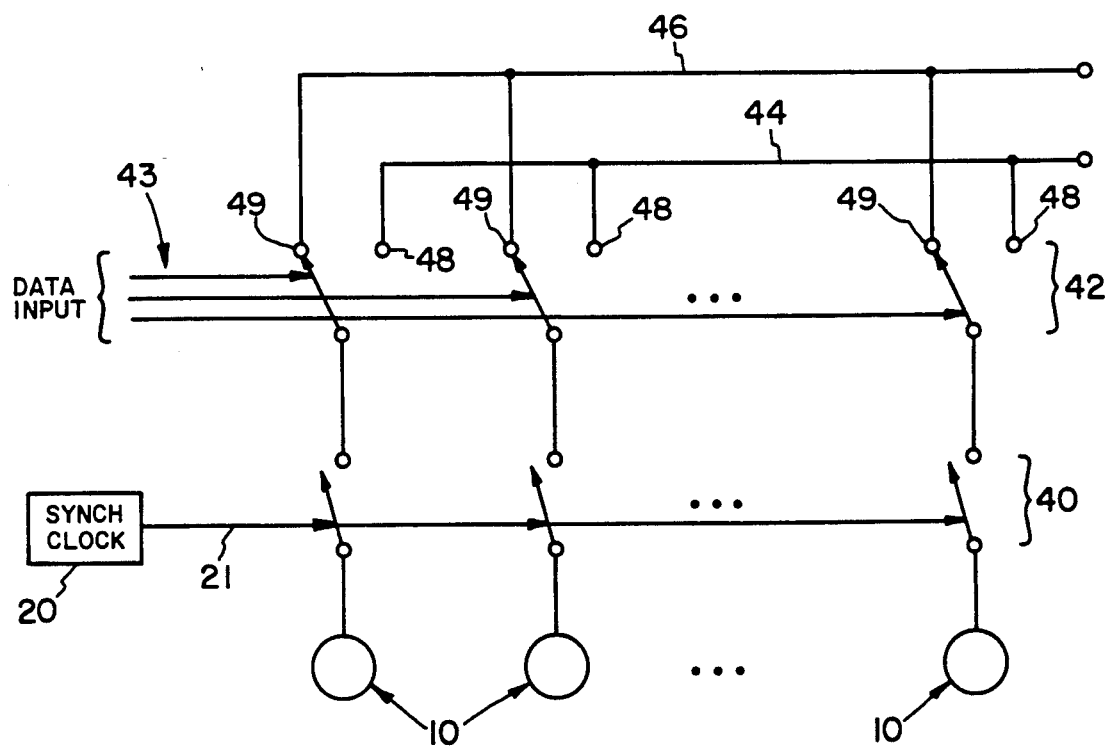
FIG. 5 is a functional schematic diagram of another embodiment of the present invention.

A third DAC configuration in accordance with the invention, having a balanced or differential output, is shown in FIG. 5. This configuration is similar to the configuration illustrated in FIG. 1, having a series-connected synchronization switch 40 and data switch 42 connected to each current source 10, which is connected to an output line 44, except that the data switches have a double-throw switch in place of a single-throw switch. The synchronizing switches 40 operate under control of a clock 20 that generates a CLOCK signal received over a clock signal line 21. The data switches receive input data over data lines 43 and are thereby controlled to one switch throw or the other. The operation of the switches is similar to that of the FIG. 1 configuration in that each current source that has a high value for its associated data input bit is connected to the output line 44, except that each current source having a low value, or zero, for its associated bit in the input data word is also connected and summed at a second output line 46.

The data switches 42 are double throw and therefore have two positions, or poles 48 and 49, in their operation, and are connected to one pole 48 if the input data bit is high and are connected to the other pole 49 if the input bit is low. That is, the data switches are connected to the first output line 44 if their associated data bit is high, and are connected to the second output line 46 if their associated data bit is low. Thus, current sources that would not be summed in the FIG. 1 configuration are used in the FIG. 5 configuration with the second output line to generate a second differential output that is proportional to the negative or complement of the input data word.

When the DAC output is taken as the difference between the two signals on the output lines 44 and 46, the desired differential output amplitude is increased over the basic single output line configuration. Also, the second output line 46 generates even harmonics, which are in-phase with the even harmonics of the first output line 44. By taking the difference between the two outputs, these undesired even harmonics are canceled. Thus, the FIG. 5 differential output configuration provides advantages over the configurations of FIGS. 1 and 3.

Figure 6:
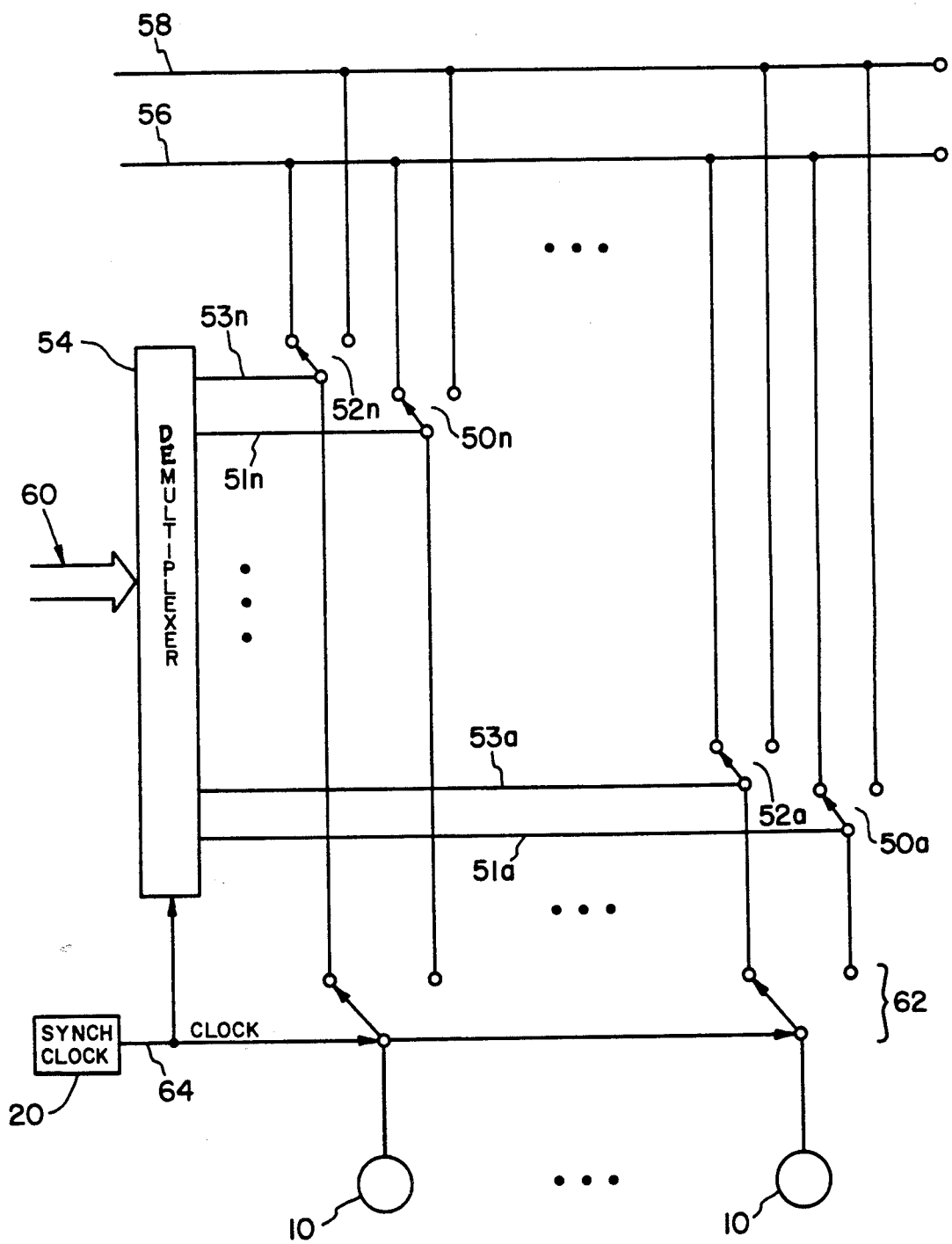
FIG. 6 is a functional schematic diagram of another embodiment of the present invention.

A fourth DAC configuration in accordance with the invention is shown in FIG. 6. This configuration has both demultiplexed data switches 50 and 52 operating under control of a demultiplexer 54 and a balanced output appearing on output lines 56 and 58. The configuration is similar to the demultiplexed data switch configuration of FIG. 3 except that the data switches 50 and 52 have a double-throw switch in place of a single-throw switch, and a second output signal is produced on the second output line 58 from the additional throw to form a differential output. The operation timing is also similar to the operation of the FIG. 3 configuration, except that the current sources 10 that have a low value, or zero, for their associated bit in the input data word are connected and summed at the new second output line 58. These current sources, which would not be summed at the output of the configuration of FIG. 3, are used to generate a second output that is proportional to the negative or complement of the data word. As in the balanced output configuration of FIG. 5, the DAC output in FIG. 6 is taken as the difference between the two outputs. This increases the desired output amplitude and decreases the undesired components at the even harmonics.

The configuration of FIG. 6 achieves the advantages of both the demultiplexed input data switch configuration of FIG. 3 and the balanced output configuration of FIG. 5. Also, an additional advantage is achieved by the FIG. 6 configuration in that the current sources 10 are never switched to an open condition in which no current flows, as occurs in the operation of the previous configurations. Rather, they are always connected to the output lines by one set of data switches 50 or the other 52. Although practical circuits can be designed to accommodate the open condition, the illustrated configuration avoids the added complexity and therefore is preferred.

The FIG. 6 configuration achieves its advantages by demultiplexing the input data appearing on the DAC input lines 60 under control of a demultiplexer 54. The demultiplexer produces two sequences of data for each bit position of the input data word, one sequence being delivered to the first set of data switches 50 over data control lines 51 and the other sequence being delivered to the second set of data switches 52 over data control lines 53. For example, the bits of a first input data word are directed to the first set of data switches 50, the bits of a second input data word are directed to the second set of data switches 52, the bits of a third input data word are directed to the first set of switches 50, and so forth. Although a pair of switches 50a and 52a are shown for the first bit position and a pair of switches 50n and 52n are shown for the nth position, it is understood that a pair is provided for each bit position.

Each one of the bit positions of the DAC is coupled to one of the precision current sources 10 by a synchronizing switch 62. The synchronizing switches operate under control of the synchronizing clock 20 by a CLOCK signal received over a control line 64. Each one of the pairs of data switches 50 and 52 is operated so as to change state only when no current is flowing through the switches. After one set of data switches has changed state and reached a settled condition, the synchronizing switches 62 are simultaneously closed to apply current to the data switches and the output lines. During this time, the other set of data switches is changing state, and when they have reached a settled condition the synchronizing switches will be operated so as to connect the second set of data switches to the current sources. In this way, transient effects and glitches on the output lines are substantially reduced.

Practical realizations of switching devices that might be used in the construction of a DAC often include parasitic elements that can couple voltage changes on the control line of the switch to the output of the switch even when the switch is in an open circuit condition. For example, if the switches are realized with a field effect transistor (FET) device, and the gate of the FET is used as the control, parasitic capacitances from the gate to the drain and source of the FET can couple voltage changes at the gate to the drain and source even when no current is flowing through the device. This effect can cause data dependent glitches to appear at the output of the DAC and produce in-band spurs.

Figure 7:
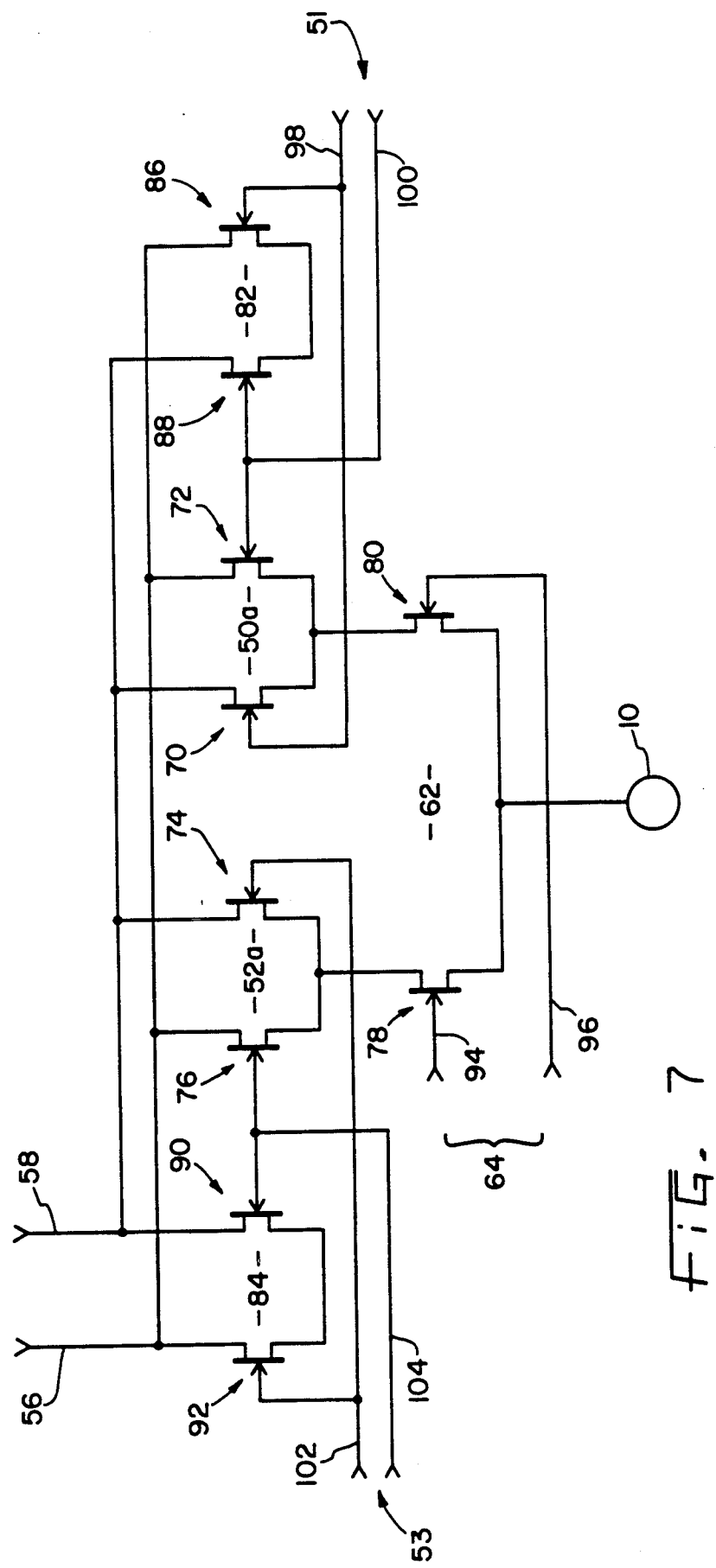
FIG. 7 is a circuit schematic diagram of a circuit implementation for one bit position of the embodiment illustrated in FIG. 6, and includes a means to cancel control signal feedthrough to the output.

A method of cancelling such parasitic effects is achieved in the configuration of FIG. 7, which shows a particular circuit realization of the data switches 50 and 52 for one of the bit positions from FIG. 6. This configuration, for example, can be implemented with field effect transistor (FET) devices constructed in gallium arsenide that are sized in proportion to the current they will carry. For each data switch, for example 50a and 52a, two FET-type devices are required. Thus, the data switch 50a is implemented with two FETs 70 and 72, and the data switch 52a is implemented with two FETs 74 and 76. Likewise, the current switch 62 associated with the data switches is implemented with two FETs 78 and 80. The FIG. 7 configuration includes a balanced output and the use of an additional dummy switch 82 and 84 for every data switch 50 and 52, respectively. The dummy switches are connected to the outputs lines 56 and 58, but are never connected to a current source 10. The controls for the dummy switches are connected to the data control lines 51 and 53 to produce a throw that is opposite that of the data switches 50 and 52 with respect to the outputs 56 and 58, respectively. Each pair of associated data switches and dummy switches 50 and 82 and also 52 and 84 are oppositely connected to the output lines 56 and 58. In this way, the parasitic effects of the switches 50 and 52 are cancelled.

At the time the voltages on the gates of the data switches 50 or 52 are changing, no current is flowing in the switch, and therefore the parasitic gate to drain and source coupling effect of the data switches are identical to that of the dummy switches, which also have no current flow. For every path of coupling between the controls and outputs through the data switches, there exists an identical path of coupling through the dummy switches to the opposite output. Because the output of the DAC is taken as the difference between the two outputs 56 and 58, glitches due to the coupling through the data switches 50 and 52 are canceled by the coupling through the dummy switches 82 and 84. In effect, the dummy switches generate a switching transient having an equal and opposite magnitude as the transient generated by each corresponding data switch. This leads to a reduction both in the data dependent glitches at the output of the DAC and in the in-band spurious response of the DDS. Like the data switches themselves, the dummy switches are implemented with two FET-type devices each. Thus, the first dummy switch 82 includes two FETs 86 and 88, and the second dummy switch 84 includes two FETs 90 and 92.

Those skilled in the art will appreciate that the FET devices of the two-FET implementation shown in FIG. 7 operate in accordance with a control signal and an inverse control signal. For example, the synchronizing control line 64 includes a first CLOCK signal line 94 and a second inverse CLOCK signal line 96. The CLOCK signal appears on the first line and the inverse CLOCK signal appears on the second line. Similarly, the data control lines 51 and 53 each include a data signal line and an inverse data signal line 98, 100 and 102, 104, respectively.

The present invention provides a high speed DAC that substantially eliminates the transient switching effects and glitches that distort the output signal of conventional DACs. A set of two series-connected switching units, a data switch and a synchronizing switch, are coupled between each current source and the DAC output lines. The synchronizing switches couple current from the current sources to the data switches such that the synchronizing switches change states approximately simultaneously and the data switches change states only when they are not carrying current. The synchronizing switches operate under control of a synchronizing clock. The switches can comprise single throw or double throw switches. Two sets of data switches can be provided for each bit position such that alternating data input words are directed to each set of data switches. In such a configuration, data input words are provided to the DAC at the system clock rate, while the changes in state for the data control lines occur at one-half the system clock rate. Various filtering schemes will be readily apparent to those skilled in the art for dealing with the half frequency noise transients.

Figure 8:
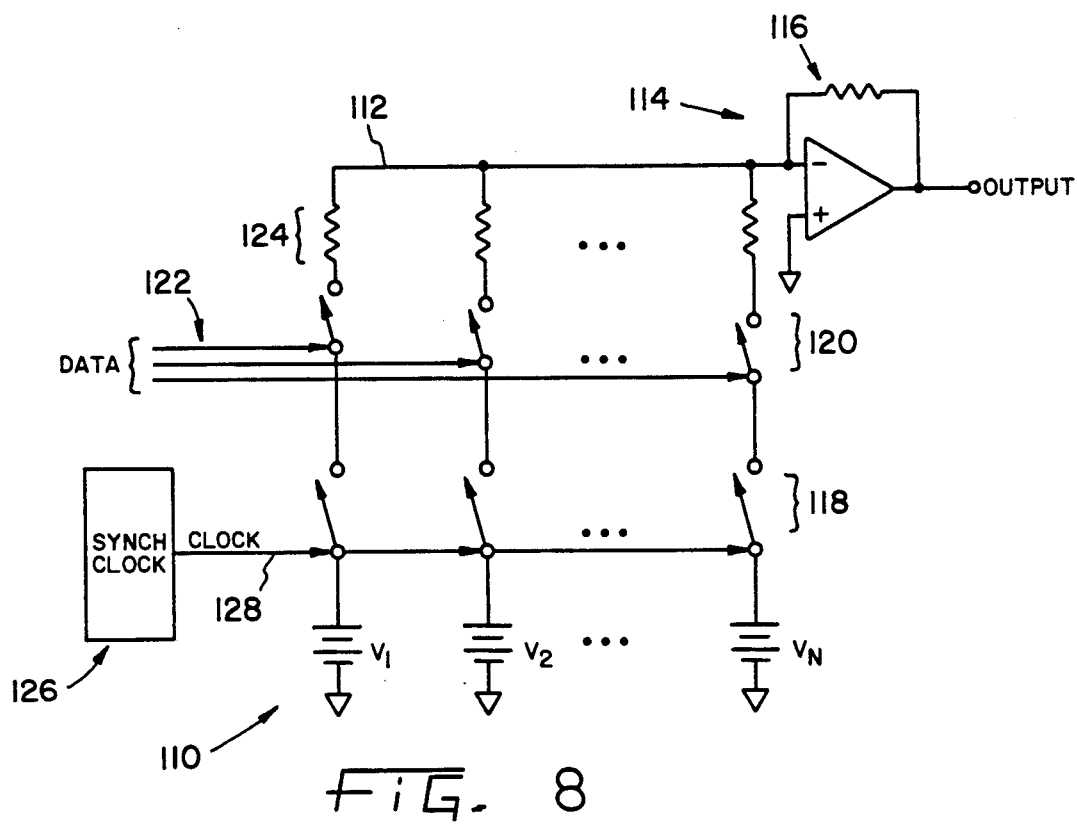
FIG. 8 is a functional schematic diagram of a switching arrangement, using voltage sources, in accordance with the present invention.

The current sources described above can be replaced by a plurality of voltage sources, in which case the output signal will be the result of summed voltages. One embodiment using voltage source is illustrated in FIG. 8, in which a plurality of binary-weighted voltage sources 110 producing voltages $V_1, V_2, \ldots, V_N$ are connected to an output line 112 having an amplifier 114 and resistor 116. A plurality of synchronizing switches 118 are connected to the voltage sources, one switch for each source, and a data switch 120 is provided in series with each synchronizing switch, connected to the output line. The data switches are operated in response to data received over data lines 122. A coupling resistor 124 is connected between each data switch 120 and the output line 112. As before, the synchronizing switches operate under control of a synchronizing clock 126, which provides a CLOCK signal over control lines 128. Other configurations of voltage sources in accordance with the present invention will occur to those skilled in the art in view of the foregoing description.

Figure 9:
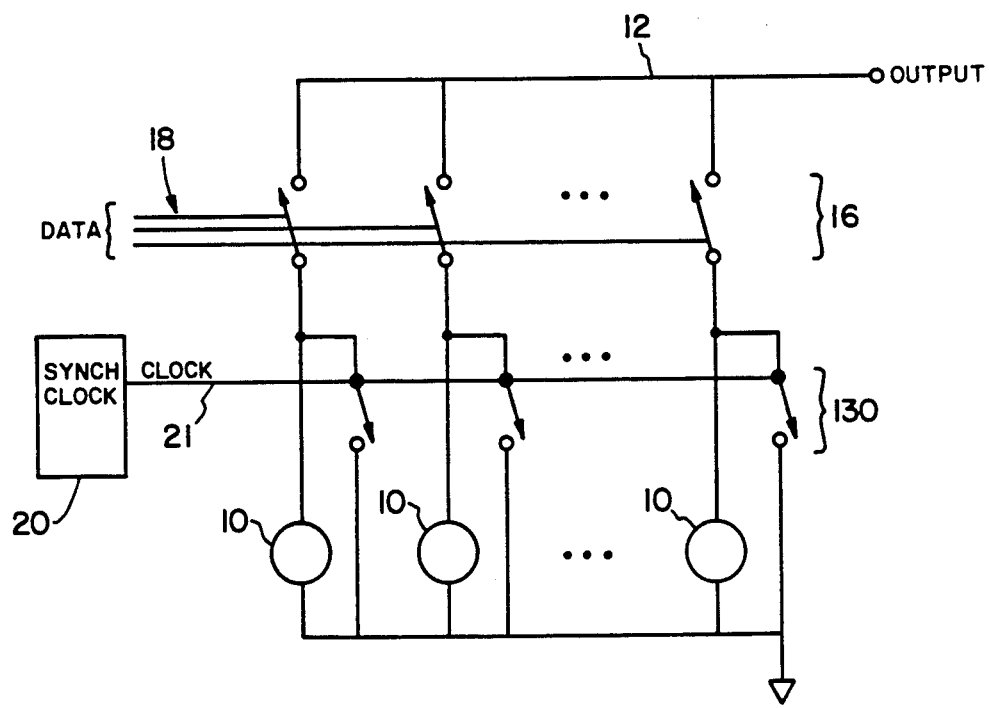
FIG. 9 is a functional schematic diagram of a switching arrangement similar to that of FIG. 1, with the FIG. 1 series switches replaced with shunt switches.

There are additional ways in which the principles of the present invention can be realized. For example, the switching arrangement illustrated in FIG. 9 is similar in operation to that of FIG. 1, except that the series-connected synchronizing switches of FIG. 1 have been replaced with shunt switches 130. As before, the switching arrangement includes a plurality of electrical signal sources 10 that are coupled to an output line 12, and data switches 16 respond to data received over data input lines 18. The shunt switches 130 perform the same function as the synchronizing switches of FIG. 1 by controlling the application of the weighted electrical signal sources to the data switches, but do so by shorting the electrical signal sources, effectively disconnecting the sources from the data switches. The shunt switches operate in response to a CLOCK signal received over a control line 21 from the synchronizing clock 20.

The FIG. 9 configuration follows the principles of the invention in that, although the summation of the electrical signal sources 10, such as current sources, is controlled by the digital data word acting on the data switches 16, the timing of when the summation of the currents appears at the output line 12 is controlled by the modulation of the signal sources, which is done through the use of the synchronizing switches 130. As explained above, conventional DACs control the summation of currents by synchronizing the bits of the digital data word, and conventional sampling techniques control the output timing by a sampling switch that samples the signal after the weighted signal sources have been summed. The present invention provides the benefits of reduced high-speed switching transients and glitches in any one of the various embodiments described above.

While the present invention has been described with respect to a preferred embodiment, it is to be understood that variations may occur to those skilled in the art. The particular components selected and their interconnections, for example, can be varied without departing from the teachings of the present invention. For example: the current sources can be other than binary weighted and can be on the integrated circuit chip implementation or can be off-chip; the current sources can be substituted with suitable weighted sources, such as voltage sources, with the switching matrix summing the weighted sources at the outputs; a higher order of multiplexing can be used; and the switches can be implemented in materials other than gallium arsenide, such as silicon. The invention, therefore, should not be seen as limited to the particular apparatus described herein, but it should be understood that the present invention has wide applicability with respect to digital-to-analog converters. Such alternative configurations can be achieved by those skilled in the art in view of the description above.

We claim:

1. A digital-to-analog converter, for converting a stream of input words comprising a plurality of high and low digital data bits received on a set of input lines at a sampling frequency into a consenter analog output signal on the converter output line, comprising:

electric signal means for producing a plurality of predetermined electrical signals such that an electrical signal of predetermined magnitude is associated with each bit of the data word to be converted;

data means responsive to a received data bit;

synchronizing means for connecting and disconnecting each electrical signal of the electrical signal means to the data means;

the data means connecting and disconnecting each electrical signal supplied by the synchronizing means to the output line in response to a received data bit; and digital control means for controlling the synchronizing means such that the synchronizing means connects the electrical signals to the data means only when the data means is not responding to a received data bit.

2. A digital-to-analog converter as recited in claim 1, wherein:

the electric signal means includes a plurality of current sources each of which produces a predetermined electrical current;

the synchronizing means comprises a synchronizing switch connected to each current source; and the data means comprises a data switch connected between the output line and each synchronizing switch.

3. A digital-to-analog consenter as recited in claim 2, wherein the synchronizing switches are single-pole shunt switches.

4. A digital-to-analog consenter as recited in claim 2, wherein the data switches are single-pole switches and the synchronizing switches are single-pole switches.

5. A digital-to-analog converter as recited in claim 2, wherein the data switches are single-pole switches and the synchronizing switches are double-pole switches.

6. A digital-to-analog converter as recited in claim 2 further comprising a further converter output line, wherein the data switches are double-pole switches and the synchronizing switches are single-pole switches.

7. A digital-to-analog converter as recited in claim 2 further comprising a further converter output line, wherein the data switches and the synchronizing switches are double-pole switches.

8. A digital-to-analog converter as recited in claim 2 further comprising a further converter output line, wherein the data switches comprise first and second double-pole switches associated with each input data bit, the converter further including:

demultiplexing means for directing every other input data word to the first double-pole data switch, and the remaining input data words to the second double-pole data switch.

9. A digital-to-analog converter as recited in claim 1, wherein:

the electric signal means includes a plurality of voltage sources each of which produces a predetermined voltage;

the synchronizing means comprises a synchronizing switch connected to each voltage source; and the data means comprises a data switch connected between the output lines and each synchronizing switch.

10. A digital-to-analog converter, for converting a stream of input words comprising a plurality of high and low digital data bits received on a set of input lines at a sampling frequency into an analog output signal provided on a pair of differential output lines, comprising:

- electric source means for producing a plurality of electrical signals such that an electrical signal of predetermined magnitude is associated with each data bit to be converted;
- switching matrix means, comprising a plurality of data logic switches, for connecting each electrical signal to one differential output line when its associated data bit is high and connecting each electrical signal to the other differential output line when its associated data bit is low; and
- digital control means for controlling the switching matrix means such that the data logic switches are operated only when no electrical signal is flowing through them.

11. A digital-to-analog converter as recited in claim 10, wherein:
- the electric source means includes a plurality of precision current sources each of which produces a predetermined electrical current; and
- the switching matrix means includes a pair of data logic switches connected between the output lines and the associated precision current source, and a current switch, associated with each precision current source, that alternately connects each of the data logic switch pairs to each precision current switch.

12. A digital-to-analog converter as recited in claim 11, wherein the current switches alternately connect one and then the other of the data logic switch pairs at the sampling frequency.

13. A digital-to-analog converter as recited in claim 11, wherein the switching matrix means comprises a plurality of semiconductor switching devices 14. A digital-to-analog converter as recited in claim 13, wherein the semiconductor switching devices are fabricated in gallium arsenide.

15. A digital-to-analog converter as recited in claim 13, further comprising transient means for generating a switching transient having an equal and opposite magnitude as that generated by each data logic semiconductor switching device.

16. A digital-to-analog converter as recited in claim 15, wherein the transient means comprises a set of semiconductor switches connected to the data logic switches.

17. A digital-to-analog converter as recited in claim 16, wherein the transient means semiconductor switches are sized in proportion to the magnitude of the current they will carry.

18. A digital-to-analog converter, for converting a stream of input words comprising a plurality of digital data bits received on a set of input lines at a sampling frequency into an analog output signal provided on a pair of differential output lines, comprising:
- current source means for producing a plurality of electrical currents such that an electrical current of predetermined magnitude is associated with each data bit to be converted;
- switching matrix means, comprising a set of two data logic switches connected to the input lines associated with each data bit to be converted and a current switch associated with each pair of data logic switches, for establishing a data logic switch setting representative of the input word to be converted and connecting each electrical current with the differential output lines through the current switches and data logic switches; and
- digital control means for operating the current switches to alternately select between each of the data logic switches at the sampling frequency.

19. A digital-to-analog converter as recited in claim 18, wherein the digital control means selects the data logic switch for connection with each electrical current according to which switch is not at that time having its data logic switch setting established.

20. A digital-to-analog converter as recited in claim 19, wherein the data logic switches and current switches are semiconductor switches.

21. A digital-to-analog converter as recited in claim 20, wherein the semiconductor switches are fabricated in gallium arsenide.

22. A digital-to-analog converter as recited in claim 20, further comprising transient means for generating a switching transient having an equal and opposite magnitude as that generated by each data logic switch.

23. A digital-to-analog converter as recited in claim 22, wherein the transient means comprises a set of semiconductor switches connected to the data logic switches.

24. A digital-to-analog converter as recited in claim 23, wherein the transient means semiconductor switches are sized in proportion to the magnitude of the current they will carry.

25. A switching matrix, adapted to be connected between a plurality of parallel input lines and an output line, and receiving a plurality of electrical signals of predetermined magnitude, comprising:
- data means for receiving a plurality of data words, comprising high and low data bits, at a sampling frequency and for switching between a conducting state in response to a high data bit and a non-conducting state in response to a low data bit; and
- synchronizing means for associating each electrical signal with an input line and for applying the electrical signals to the output line after the data means has responded to a data word.

26. A switching matrix as recited in claim 25, wherein the data means and the synchronizing means comprise single-pole switches.

27. A method of converting a sequence of digital input words at a data clock rate frequency into an analog output signal on output lines comprising the steps of:
- demultiplexing the sequence of digital words into alternating first and second sequences of input words each at a frequency less that the data clock rate;
- coupling the first sequence of input words with a first set of current switches to periodically update the status of those switches, the first set of current switches being connected to the output lines; and
- coupling the second sequence of input words with a second set of current switches to periodically update the status of the second set of switches, the second set of switches also being connected to the output lines; and
- supplying current to one set of switches while the status of the other set of switches is being updated.

* * * * *